United States Patent
Ragupathi et al.

(10) Patent No.: US 10,225,095 B2
(45) Date of Patent: Mar. 5, 2019

(54) SYSTEMS AND METHODS FOR ONE-TO-MANY WIRELESS ACCESS TO MANAGEMENT CONTROLLERS

(71) Applicant: Dell Products L.P., Round Rock, TX (US)

(72) Inventors: Dinesh Kunnathur Ragupathi, Round Rock, TX (US); Elie Antoun Jreij, Pflugerville, TX (US); Venkatesh Ramamoorthy, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 101 days.

(21) Appl. No.: 14/697,364

(22) Filed: Apr. 27, 2015

(65) Prior Publication Data
US 2016/0315805 A1 Oct. 27, 2016

(51) Int. Cl.
*H04L 12/18* (2006.01)
*H04L 12/24* (2006.01)

(52) U.S. Cl.
CPC .......... *H04L 12/189* (2013.01); *H04L 41/042* (2013.01)

(58) Field of Classification Search
CPC . H04L 41/0803; H04L 12/189; H04L 65/105; H04L 67/1002; H04L 67/1097; H04L 29/08099; H04L 67/28; H04L 41/042; H04W 92/02; H04W 88/18; H04W 4/80; H04W 88/06; H04B 5/0031
See application file for complete search history.

(56) References Cited

U.S. PATENT DOCUMENTS

| | | | |
|---|---|---|---|
| 6,515,994 B1* | 2/2003 | Chuah | H04L 12/185 370/395.6 |
| 9,477,260 B2 | 10/2016 | Hartman et al. | |
| 2007/0198634 A1* | 8/2007 | Knowles | G06F 17/30902 709/203 |
| 2010/0070563 A1* | 3/2010 | Baker | H04L 65/1046 709/203 |
| 2010/0153807 A1* | 6/2010 | Kakani | H04L 12/1863 714/749 |
| 2011/0080703 A1* | 4/2011 | Schlesener | G06F 1/1616 361/679.27 |
| 2013/0247033 A1* | 9/2013 | Sawhney | G06F 21/50 718/1 |

(Continued)

*Primary Examiner* — Paul H Masur
*Assistant Examiner* — Michael K Phillips
(74) *Attorney, Agent, or Firm* — Jackson Walker L.L.P.

(57) ABSTRACT

In accordance with embodiments of the present disclosure, an information handling system may include a processor, a management controller communicatively coupled to the processor and configured to provide out-of-band management of the information handling system, and an interface for communicatively coupling the management controller to a second information handling system external to the information handling system for out-of-band management of the information handling system. The management controller may be further configured to serve as a proxy between one or more target management controllers of one or more other information handling systems and the second information handling system to facilitate out-of-band management of the one or more other information handling systems by the second information handling system while communicatively coupled to the interface.

13 Claims, 5 Drawing Sheets

(56) References Cited

U.S. PATENT DOCUMENTS

| | | | |
|---|---|---|---|
| 2014/0181891 A1* | 6/2014 | Von Bokern | H04L 63/20 726/1 |
| 2014/0207902 A1* | 7/2014 | Joshi | G06F 9/4401 709/217 |
| 2014/0215030 A1* | 7/2014 | Terwilliger | G06F 11/3006 709/220 |
| 2015/0024697 A1* | 1/2015 | Holtman | G06F 1/1632 455/79 |
| 2015/0222517 A1* | 8/2015 | McLaughlin | H04W 4/70 713/156 |
| 2016/0091871 A1* | 3/2016 | Marti | G06F 3/01 702/188 |

* cited by examiner

SYSTEMS AND METHODS FOR ONE-TO-MANY WIRELESS ACCESS TO MANAGEMENT CONTROLLERS

TECHNICAL FIELD

The present disclosure relates in general to information handling systems, and more particularly to systems and methods for providing communications access to multiple management controllers via a wireless communications interface between a single management controller housed in an information handling system and another information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In future information handling system designs, some information handling systems may include an interface such as a near-field communication interface for permitting access to a management controller of the information handling system by another information handling system. In some embodiments, such interface may be present in a special bezel or cover that includes circuitry for the interface. However, it may not be possible to include bezels or interface circuitry on every information handling system within an enterprise. For example, some servers, such as blade servers, may not include bezels making such solution practical for modular servers. In addition, it may be practical to perform near-field communication transactions for servers at the top of or bottom of a server rack as it may be hard to place an external information handling system (e.g., mobile device) within close enough proximity to maintain near-field communication with such servers. Furthermore, even if bezels could be coupled to every information handling system in an enterprise, some users may desire not to, as such bezels may interfere with cooling and/or interfere with hot-plugging of disk drives or other information handling resources. In other embodiments, a wireless module may be present within an enclosure, but space constraints, cooling constraints, and other constraints may make it desirable not to include a wireless modules dedicated to each information handling system in an enclosure.

SUMMARY

In accordance with the teachings of the present disclosure, the disadvantages and problems associated with provision of communication access to many management controllers may be reduced or eliminated.

In accordance with embodiments of the present disclosure, an information handling system may include a processor, a management controller communicatively coupled to the processor and configured to provide out-of-band management of the information handling system, and an interface for communicatively coupling the management controller to a second information handling system external to the information handling system for out-of-band management of the information handling system. The management controller may be further configured to serve as a proxy between one or more target management controllers of one or more other information handling systems and the second information handling system to facilitate out-of-band management of the one or more other information handling systems by the second information handling system while communicatively coupled to the interface.

In accordance with these and other embodiments of the present disclosure, a method may include communicatively coupling, by a management controller configured to provide out-of-band management of a first information handling system, to a second information handling system, in order to facilitate out-of-band management of the first information handling system by the second information handling system. The method may also include operating, by the management controller, as a proxy between one or more target management controllers of one or more other information handling systems and the second information handling system to facilitate out-of-band management of the one or more other information handling systems by the second information handling system while communicatively coupled to the management controller.

In accordance with these and other embodiments of the present disclosure, an article of manufacture may include a non-transitory computer-readable medium and computer-executable instructions carried on the computer-readable medium, the instructions readable by a processor. The instructions, when read and executed, may cause the processor to, in a first information handling system comprising a management controller communicatively configured to provide out-of-band management of the information handling system, communicatively couple the management controller to a second information handling system, in order to facilitate out-of-band management of the first information handling system by the second information handling system and operate the management controller as a proxy between one or more target management controllers of one or more other information handling systems and the second information handling system to facilitate out-of-band management of the one or more other information handling systems by the second information handling system while communicatively coupled to the management controller.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
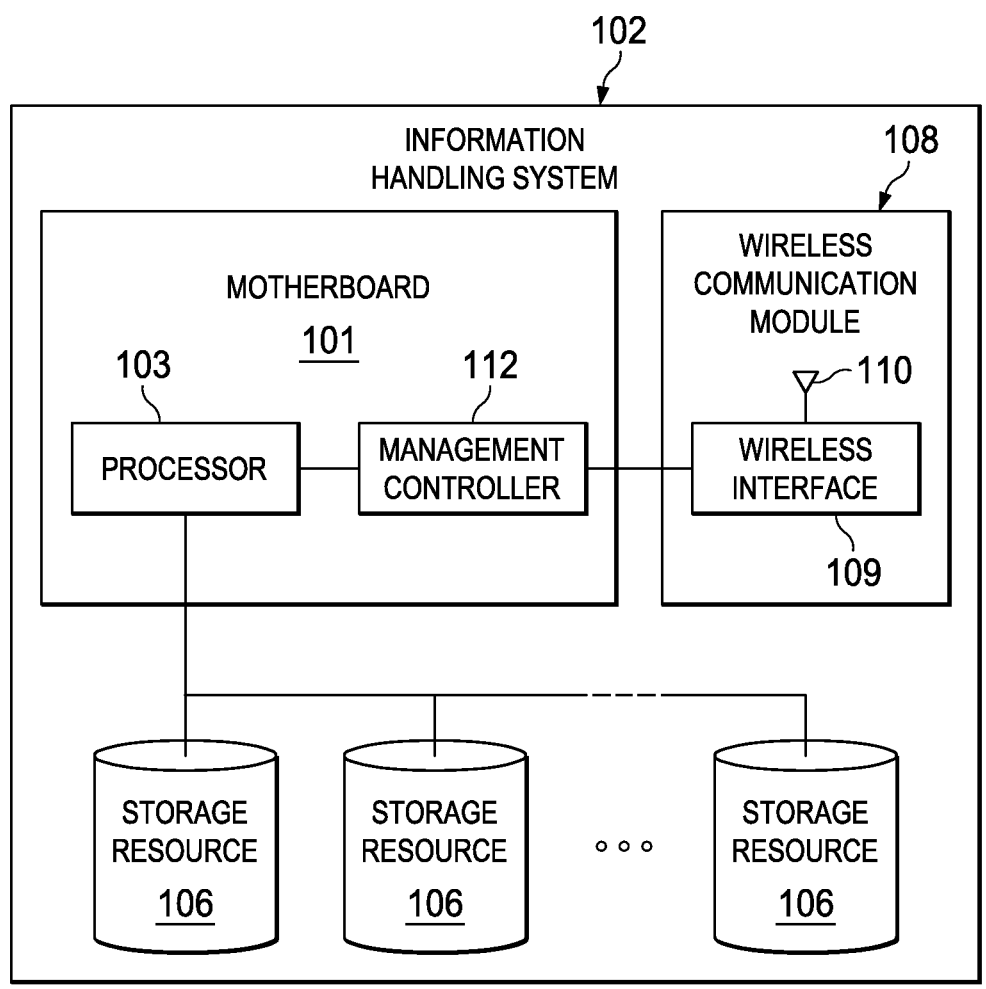
FIG. 1 illustrates a block diagram of selected components of an example information handling system, in accordance with embodiments of the present disclosure.

Preferred embodiments and their advantages are best understood by reference to FIGS. 1-5, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

The terms "wireless transmissions" and "wireless communication" may be used to refer to all types of electromagnetic communications which do not require a wire, cable, or other types of conduits. Examples of wireless transmissions which may be used include, but are not limited to, short-range wireless communication technologies (e.g., proximity card, Radio-Frequency Identification (RFID), Near Field Communication (NFC), BLUETOOTH, ISO 14443, ISO 15693, Wifi, or other suitable standard), personal area networks (PAN) (e.g., BLUETOOTH), local area networks (LAN), wide area networks (WAN), narrowband personal communications services (PCS), broadband PCS, circuit switched cellular, cellular digital packet data (CDPD), radio frequencies, such as the 800 MHz, 900 MHz, 1.9 GHz and 2.4 GHz bands, infra-red and laser.

For the purpose of this disclosure, "short-range wireless communications technology" refers to any suitable communications transport, protocol, and/or standard allowing two or more suitably-configured devices to communicate via wireless transmissions provided that such devices are within approximately one meter of each other. Examples of short-range communications technologies include, without limitation, BLUETOOTH Class 3, near field communication (NFC), radio frequency identification (RFID), proximity card, vicinity card, ISO 14443, WiFi, and ISO 15693.

FIG. 1 illustrates a block diagram of an example of an information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer. In yet other embodiments, information handling system 102 may be a mobile device sized and shaped to be readily transported and carried on a person of a user of information handling system 102 (e.g., a smart phone, a tablet computing device, a handheld computing device, a personal digital assistant, etc.).

As shown in FIG. 1, information handling system 102 may include a motherboard 101, one or more storage resources 106, and a wireless communication module 108. Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103 and a management controller 112 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource 106, memory and/or another component of information handling system 102.

A management controller 112 may be communicatively coupled to processor 103 and may comprise any system, device, or apparatus configured to facilitate management and/or control of components of information handling system 102, information handling systems modularly coupled within, and/or one or more of its component information handling resources. Management controller 112 may be configured to issue commands and/or other signals to manage and/or control information handling resources of information handling system 102. Management controller 112 may comprise a microprocessor, microcontroller, DSP, ASIC, field programmable gate array ("FPGA"), EEPROM, or any combination thereof.

In addition or alternatively, management controller 112 may also provide a management console for user/administrator access to these functions. For example, management controller 112 may provide for communication with a user interface, permitting a user to interact with management controller 112 and configure control and management of components of information handling system 102 by management controller 112. As another example, management controller 112 may act as a proxy and establish communication between two information handling resources by either configuring them to directly couple to each other or transfer information by receiving information from one information handling resource, processing the information if needed, and then transferring the information to the other information handling resource. As a further example, management controller 112 may implement Web Services Management ("WS-MAN") or another suitable management protocol permitting a user to remotely access a management controller 112 to configure information handling system 102 and its various information handling resources. In such embodiments, management controller 112 may interface with a network interface separate from a traditional network interface of information handling system 102, thus allowing for "out-of-band" control of information handling system 102, such that communications to and from management controller 112 are communicated via a management channel physically isolated from an "in band" communication channel with the traditional network interface. Thus, for example, if a failure occurs in information handling system 102 that prevents an administrator from interfacing with information handling system 102 via a traditional network interface and/or user interface (e.g., operating system failure, power failure, etc.), the administrator may still be able to monitor and/or manage information handling system 102 (e.g., to diagnose problems that may have caused failure) via management controller 112. In the same or alternative embodiments, management controller 112 may allow an administrator to remotely manage one or more parameters associated with operation of information handling system 102 and its various information handling resources (e.g., power usage, processor allocation, memory allocation, security privileges, etc.). In certain embodiments, management controller 112 may include or may be an integral part of a chassis management controller (CMC), a baseboard management controller (BMC), Dell Remote Management controller (DRAC) or an Integrated Dell Remote Management controller (iDRAC). In these and other embodiments, management controller 112 may also be referred to as an access controller or a life-cycle controller.

Storage resources 106 may be communicatively coupled to processor 103, and may include any system, device, or apparatus configured to retain program instructions and/or data for a period of time (e.g., computer-readable media). Storage resources 106 may include hard disk drives, magnetic tape libraries, optical disk drives, magneto-optical disk drives, compact disk drives, compact disk arrays, disk array controllers, and/or any other system, apparatus or device operable to store media.

Wireless communication module 108 may be communicatively coupled to management controller 112 and may comprise any suitable system, apparatus, or device operable to serve as an interface between management controller 112 and another information handling system and/or a network. As shown in FIG. 1, wireless communication module 108 may comprise a wireless interface 109 communicatively coupled to management controller 112 and an antenna 110. Wireless interface 109 may enable information handling system 102 to communicate using any suitable transmission protocol and/or standard. In some embodiments, wireless interface 109 may be configured to communicate with another information handling system (e.g., a tablet, notebook, hand-held computer, mobile telephony device, etc.) via wireless transmissions, thus allowing a user of such other information handling system to perform management operations on management controller 112 via such other information handling system and wireless interface 109. In particular embodiments, wireless interface 109 may be configured to communicate with another information handling system via a short-range wireless communications technology. In these and other embodiments, wireless interface 109 may comprise a network interface card, or "NIC."

Antenna 110 may be communicatively coupled to wireless interface 109, and may comprise any system, device, or apparatus configured to convert electric power into radio waves, and vice versa.

In addition to motherboard 101, processor 103, storage resources 106, management controller 112, and wireless communication module 108, wireless interface 109, and antenna 110, information handling system 102 may include one or more other information handling resources.

Figure 2:
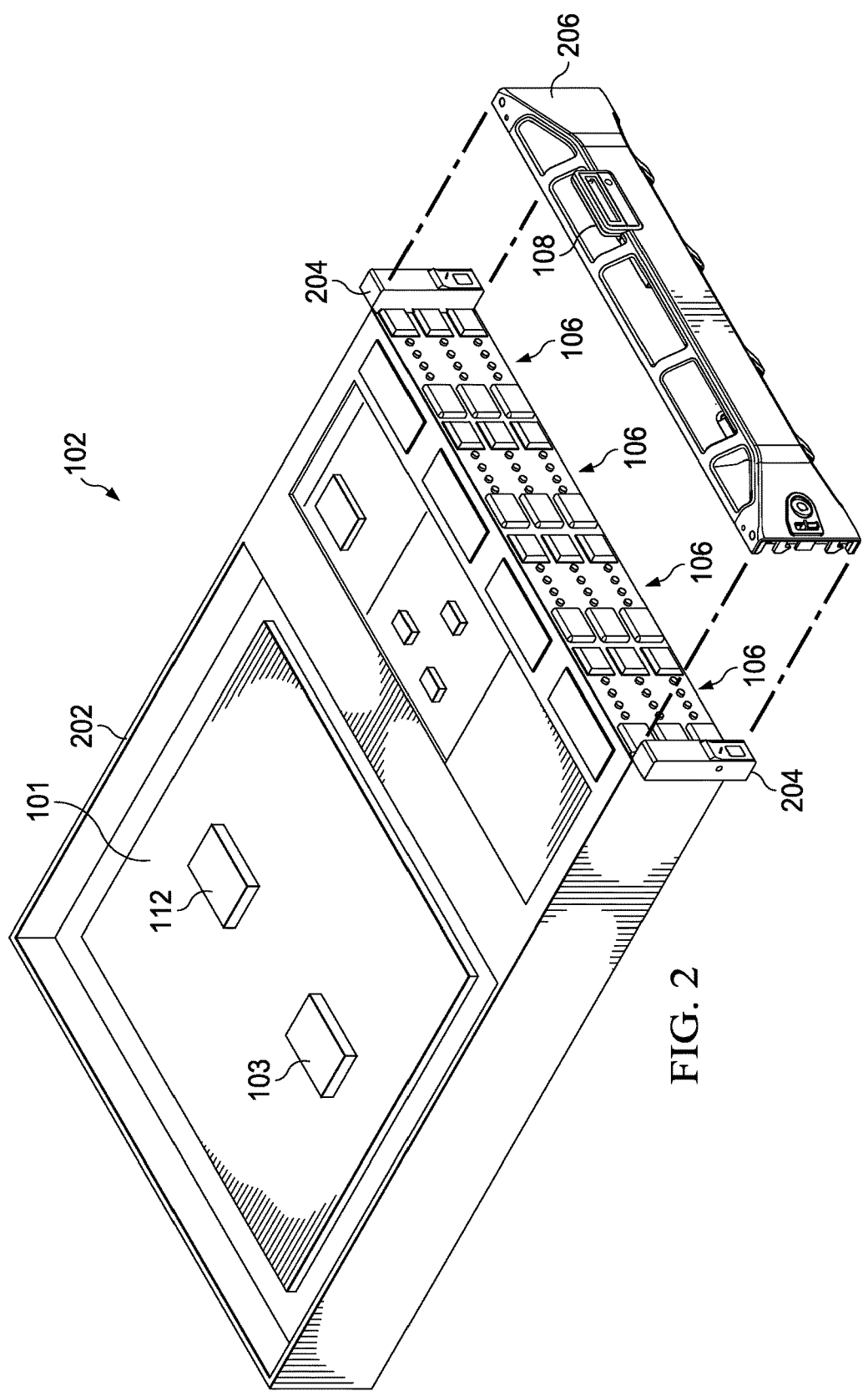
FIG. 2 illustrates a perspective view of selected components of the example information handling system of FIG. 1, in accordance with embodiments of the present disclosure.

FIG. 2 illustrates a perspective view of selected components of information handling system 102, in accordance with embodiments of the present disclosure. As shown in FIG. 2, information handling system 102 may comprise a housing 202 to house components of information handling system 102. In some embodiments, housing 202 may include a chassis or other enclosure including one or more mechanical features for supporting the various components of information handling system 102. In other embodiments, housing 202 may comprise a drawer or tray configured to be inserted into or removed from a server rack for housing multiple information handling systems.

As shown in FIG. 2, housing 202 may include ears 204 and a bezel 206. Bezel 206 may comprise any suitable mechanical structure for covering a front portion of information handling system 102. For example, bezel 206 may cover storage resources 106 and/or other information handling resources for purposes of security and/or aesthetics. In some embodiments, bezel 206 may be readily detachable from the remainder of housing 202 via ears 204. Bezel 206 may also include one or more mechanical features for housing wireless communication module 108.

Although the embodiments represented by FIG. 2 depict storage resources 106 residing behind bezel 206, in other embodiments, information handling resources in addition to or in lieu of may reside behind bezel 206. In any of such embodiments, the information handling resources covered by bezel 206 may be readily-removable and readily-insertable (e.g., "hot-pluggable") information handling resources.

An ear 204 may include one or more mechanical features for mechanically coupling bezel 206 to the remainder of housing 202 via corresponding mechanical features of bezel 206. In addition, at least one ear 204 and bezel 206 may include corresponding electrically-conductive components permitting wireless communication module 108 to draw power, provide alerts, and/or communicatively couple to management controller 112 when bezel 206 is engaged with ears 204. In embodiments in which housing 202 comprises a drawer or sled, ears 204 may comprise mechanical components to allow a user to slide housing 202 into or out of a rack. Mechanical coupling of bezel 206 to ears 204, and electrical coupling of wireless communication module 108 to management controller 112 may be accomplished in any suitable manner, including without limitation as set forth in U.S. Ser. application Ser. No. 14/601,469 filed Jan. 21, 2015 and entitled "Systems and Methods for Coupling Information Handling Resource Disposed in Information Handling System Bezel."

Although FIG. 2 represents one or more embodiments for coupling a wireless communication module 108 to an information handling system 102, it is understood that many other approaches for coupling a wireless communication module 108 may be utilized in accordance with this disclosure. For example, in some embodiments, a wireless communication module 108 may be coupled to an external port (e.g., a Universal Serial Bus port) of an information handling system 102. As another example, a wireless communication module 108 may be internal to a housing of an information handling system.

Figure 3:
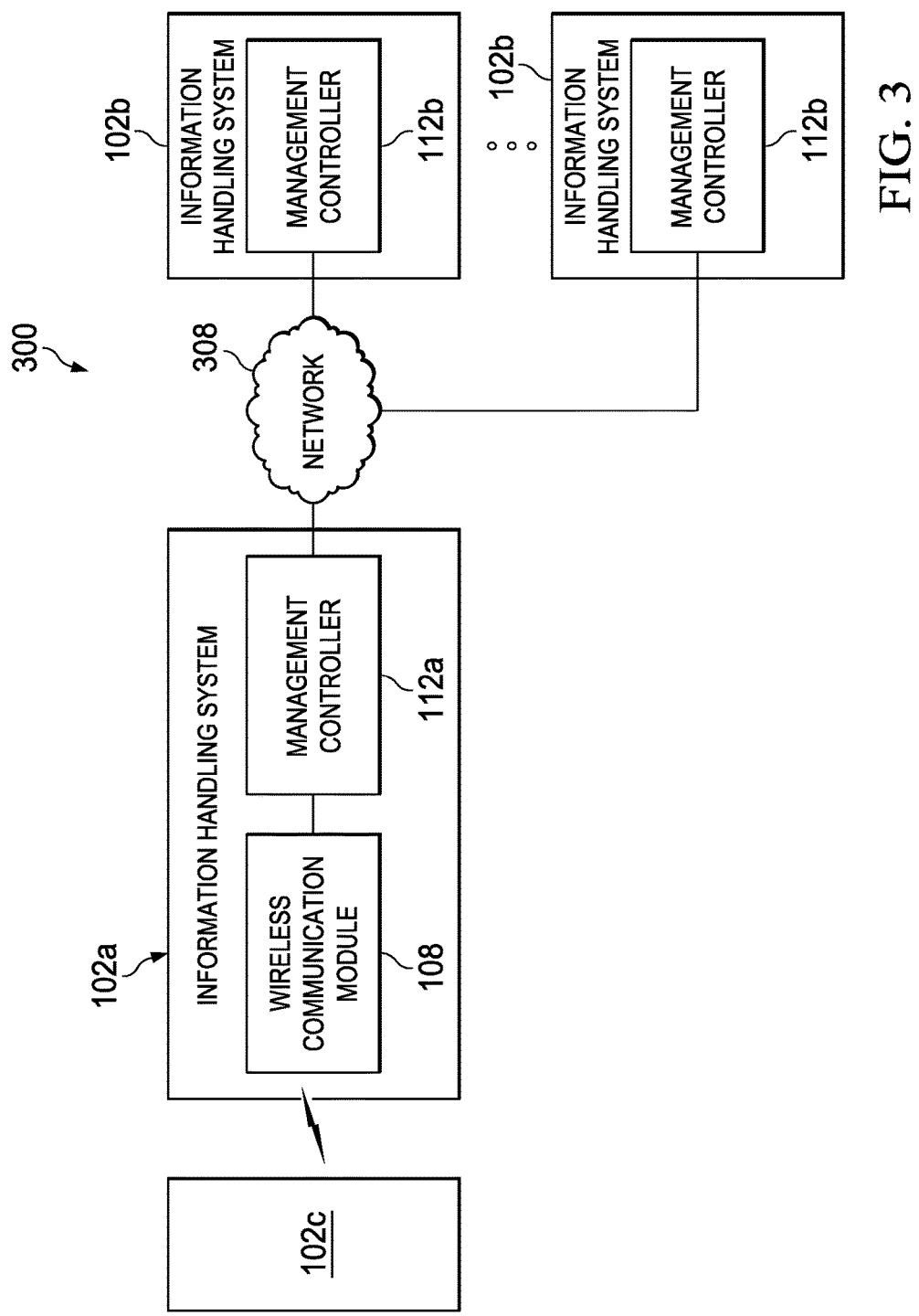
FIG. 3 illustrates a system for one-to-many wireless access to management controllers, in accordance with embodiments of the present disclosure.

FIG. 3 illustrates a system 300 for one-to-many wireless access to management controllers 112, in accordance with embodiments of the present disclosure. As shown in FIG. 3, system 300 may include at least one information handling system 102a having a wireless communication module 108 coupled to a management controller 112a of information handling system 102a, one or more information handling systems 102b having associated management controllers 112b but without wireless communication modules, a mobile information handling system 102c, and a network 308. For purposes of exposition, information handling systems 102 within system 300 are shown with only a very small portion of their components. In addition, for purposes of exposition, system 300 is shown as having only one information handling system 102a having a wireless communication module 108 coupled to a management controller 112a thereof, although in some embodiments, system 300 may have a plurality of information handling systems 102a each having a respective wireless communication module 108 coupled to a respective management controller 112a thereof. Mobile information handling system 102c may comprise a tablet, notebook, hand-held computer, mobile telephony device, or other suitable highly-portable device, and may be configured to execute system management software for interfacing with and managing information handling systems 102 via their respective management controllers 112. The various information handling systems 102a and 102b depicted in FIG. 3 may be located in the same physical rack, in different physical racks in a data center, or in different rooms or buildings.

Network 308 may be a network and/or fabric configured to couple information handling systems 102 to one another. In these and other embodiments, network 308 may include a communication infrastructure, which provides physical connections, and a management layer, which organizes the physical connections and information handling systems communicatively coupled to network 308. Network 308 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or any other appropriate architecture or system that facilitates the communication of signals, data and/or messages (generally referred to as data). Network 308 may transmit data via wireless transmissions and/or wire-line transmissions using any storage and/or communication protocol, including without limitation, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or any other transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 308 and its various components may be implemented using hardware, software, or any combination thereof.

Figure 4:
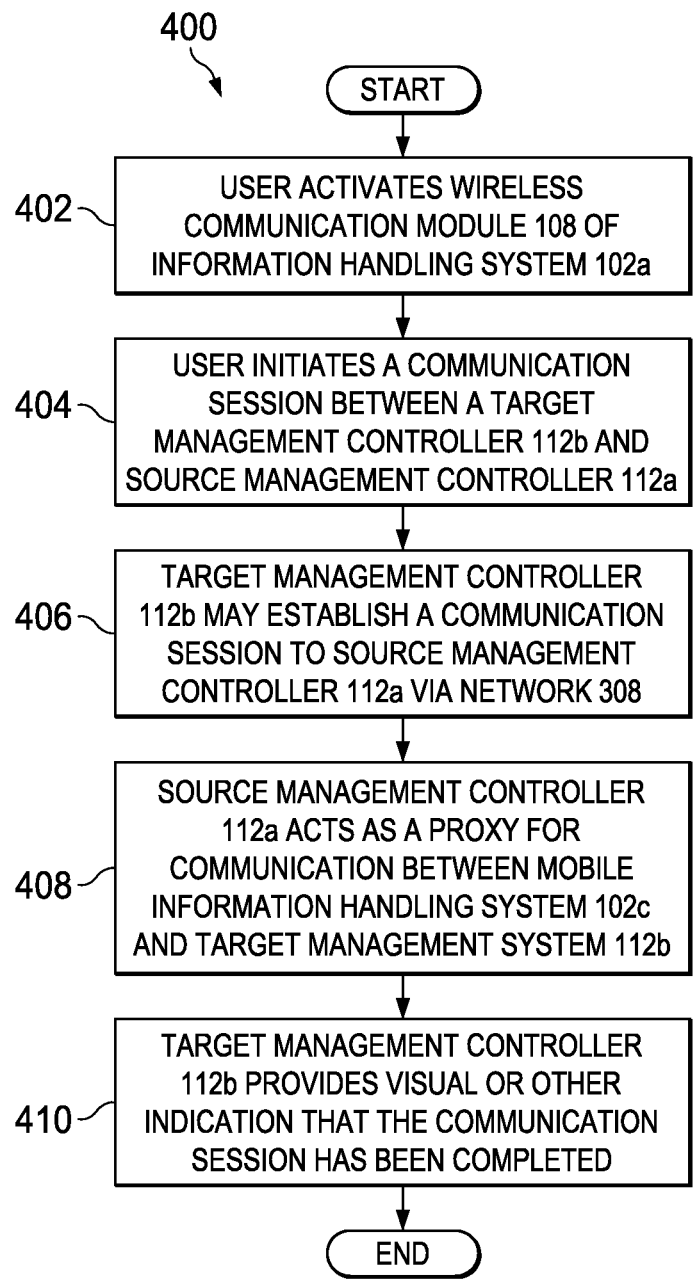
FIG. 4 illustrates a flow chart of an example method for providing wireless access to a target management controller from a source management controller in an information handling system having a wireless communication module coupled to the source management controller, in accordance with embodiments of the present disclosure.

FIG. 4 illustrates a flow chart of an example method 400 for providing wireless access to a target management controller 112b from a source management controller 112a in an information handling system 102a having a wireless communication module 108 coupled to the management controller 112a, in accordance with embodiments of the present disclosure. According to some embodiments, method 400 may begin at step 402. As noted above, teachings of the present disclosure may be implemented in a variety of configurations of system 300. As such, the preferred initialization point for method 400 and the order of the steps comprising method 400 may depend on the implementation chosen.

At step 402, a user may activate wireless communication module 108 of information handling system 102a. In some embodiments, such activation may comprise the user's interaction with a button or similar user interface device on information handling system 102a (e.g., a button present on bezel 206). Once activated, wireless communication module 108 may be enabled to undertake communication with mobile information handling system 102c.

At step 404, the user may initiate a communication session between a target management controller 112b on an information handling system 102b and source management controller 112a, for example by interacting with a button or similar user interface device on the information handling system 102b (e.g., by depressing a button on the information handling system in a defined pattern or sequence).

At step 406, in response to the user's initiation of the communication session, the target management controller 112b may establish a communication session to source management controller 112a via network 308, as described in greater detail below with respect to FIG. 5.

At step 408, source management controller 112a may act as a proxy for communication between mobile information handling system 102c and target management controller 112b, thus permitting wireless access to target management controller 112b from mobile information handling system 102c despite target management controller 112b lacking a wireless communication module 108.

At step 410, the target management controller 112b or another component of information handling system 102b (e.g., a light or other indicator communicatively coupled to target management controller 112b) may provide an indication that the communication session has been completed.

At the conclusion of step 410, method 400 may end.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using system 300 or any other system operable to implement method 400. In certain embodiments, method 400 may be implemented partially or fully in software and/or firmware embodied in computer-readable media.

Figure 5:
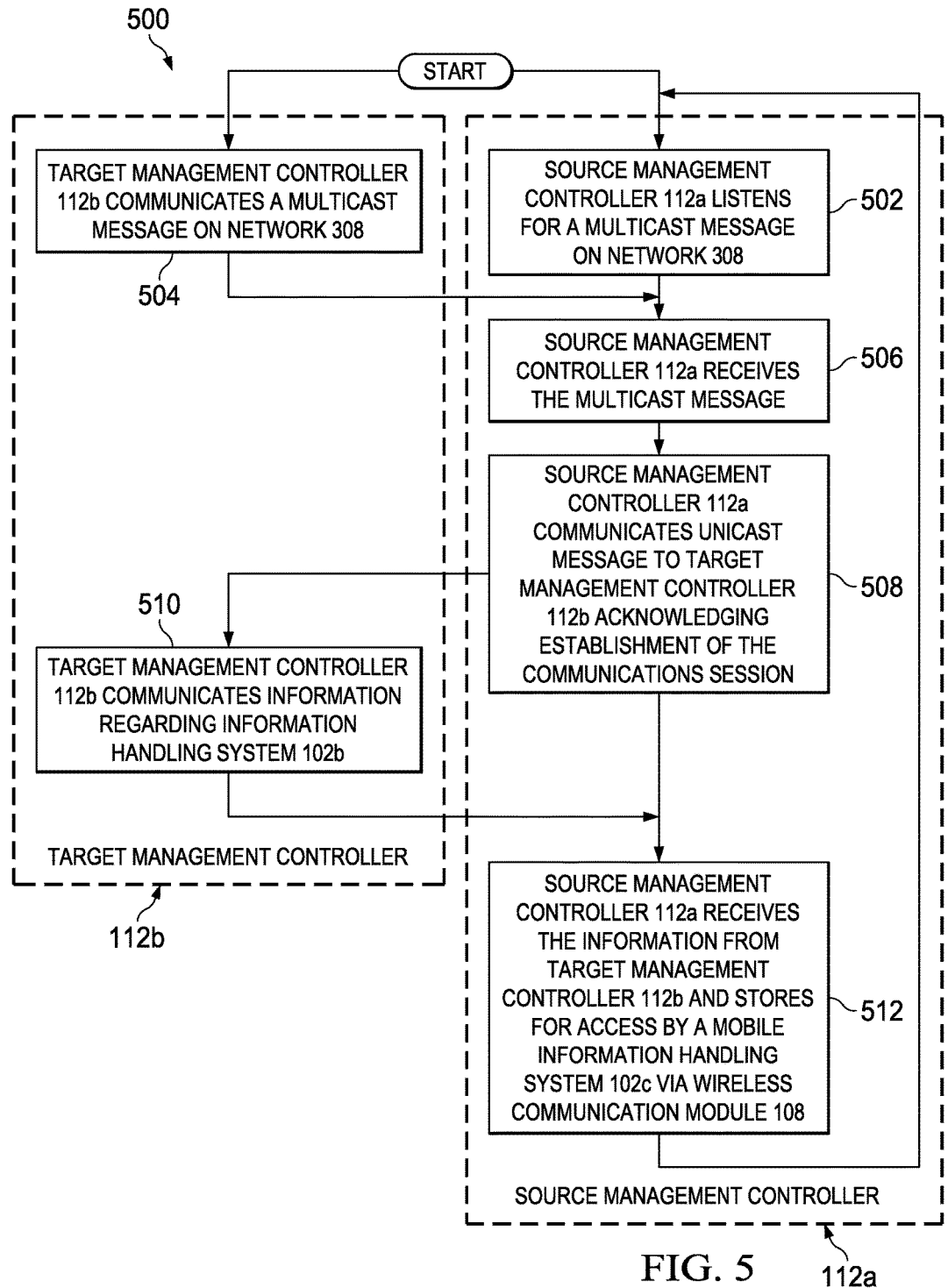
FIG. 5 illustrates a flow chart of an example method for establishing a communications session between a target management controller and a source management controller, in accordance with embodiments of the present disclosure.

FIG. 5 illustrates a flow chart of an example method 500 for establishing a communications session between a target management controller 112b and a source management controller 112a, in accordance with embodiments of the present disclosure. According to some embodiments, method 500 may begin at step 502. As noted above, teachings of the present disclosure may be implemented in a variety of configurations of system 300. As such, the preferred initialization point for method 500 and the order of the steps comprising method 500 may depend on the implementation chosen.

At step 502, a source management controller 112a may, responsive to detecting the presence of a wireless communication module 108 coupled thereto within information handling system 102a, listen for a multicast message on network 308.

At step 504, a target management controller 112b may, in response to a user's initiation of a communications session between target management controller 112b and source management controller 112a (as described above with respect to step 404 of method 400), communicate a multicast message on network 308. Such message may include identifying information (e.g., name, Internet Protocol address, etc.) for target management controller 112b. After communicating such message, target management controller 112b may listen for a response from source management controller 112a acknowledging establishment of the communications session.

At step 506, source management controller 112a may receive the multicast message from target management controller 112b and, at step 508, communicate a unicast response to target management controller 112b acknowledging establishment of the communications session, and then wait for target management controller 112b to communicate information in response to the acknowledgment.

At step 510, in response to the unicast acknowledgement message from source management controller 112a, target management controller 112b may communicate information (e.g., in an Extensible Markup Language file) regarding information handling system 102b.

At step 512, source management controller 112a may receive the information from target management controller 112b (and other target management controllers 112b coupled to network 308) and store them for access by a mobile information handling system 102c via wireless communication module 108. After completion of step 512, operation of source management controller 112a may return to step 502.

Although FIG. 5 discloses a particular number of steps to be taken with respect to method 500, method 500 may be executed with greater or fewer steps than those depicted in FIG. 5. In addition, although FIG. 5 discloses a certain order of steps to be taken with respect to method 500, the steps comprising method 500 may be completed in any suitable order.

Method 500 may be implemented using system 300 or any other system operable to implement method 500. In certain embodiments, method 500 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
 a processor;
 a management controller communicatively coupled to the processor and configured to provide out-of-band management of the information handling system, wherein the management controller comprises a baseboard management controller (BMC) and/or a chassis management controller (CMC); and a short-range wireless interface for communicatively coupling the management controller to a mobile information handling system that is external to the information handling system, the mobile information handling system being configured for out-of-band management of the information handling system via the management controller, and the management controller being configured to receive management instructions from the mobile information handling system for management of the information handling system;

wherein the management controller is further configured to serve as a proxy between the mobile information handling system and a plurality of target management controllers of a corresponding plurality of other, physically separate, information handling systems that do not include respective short-range wireless interfaces to facilitate out-of-band management of the plurality of other information handling systems by the mobile information handling system while the mobile information handling system is communicatively coupled to the short-range wireless interface, such that the mobile information handling system is able to perform out-of-band management of the plurality of other information handling systems via its connection to the management controller of the information handling system.

2. The information handling system of claim 1, wherein the management controller is configured to establish a communications session with a selected one of the target management controllers by:

receiving a multicast message from the selected target management controller via a network communicatively coupled to the selected target management controller and the management controller;

communicating an acknowledgment message to the selected target management controller; and receiving information from the selected target management controller regarding an other information handling system in which the selected target management controller is located.

3. The information handling system of claim 1, wherein the management controller is further configured to communicate to the mobile information handling system information regarding an other information handling system in which a selected target management controller is located.

4. The information handling system of claim 1, wherein the management controller is further configured to store information regarding an other information handling system in which a selected target management controller is located.

5. The information handling system of claim 1, further comprising a bezel for covering a portion of the information handling system, wherein the short-range wireless interface is integral to the bezel.

6. A method comprising:

communicatively coupling, by a management controller configured to provide out-of-band management of a first information handling system, to a mobile information handling system, via a short-range wireless connection, in order to facilitate out-of-band management of the first information handling system by the mobile information handling system, wherein the management controller comprises a baseboard management controller (BMC) and/or a chassis management controller (CMC); and operating, by the management controller, as a proxy between a plurality of target management controllers of a corresponding plurality of other, physically separate, information handling systems that do not include respective short-range wireless interfaces and the mobile information handling system to facilitate out-of-band management of the plurality of other information handling systems by the mobile information handling system while communicatively coupled to the management controller, such that the mobile information handling system is able to perform out-of-band management of the plurality of other information handling systems via its connection to the management controller of the first information handling system.

7. The method of claim 6, further comprising establishing a communications session between the management controller and a selected one of the target management controllers by:

receiving a multicast message from the selected target management controller via a network communicatively coupled to the target management controller and the management controller;

communicating an acknowledgment message to the selected target management controller; and receiving information from the selected target management controller regarding an other information handling system in which the selected target management controller is located.

8. The method of claim 6, further comprising communicating from the management controller to the mobile information handling system information regarding an other information handling system in which a selected target management controller is located.

9. The method of claim 6, further comprising storing at the management controller information regarding an other information handling system in which a selected target management controller is located.

10. An article of manufacture comprising:

a non-transitory computer-readable medium; and computer-executable instructions carried on the computer-readable medium, the instructions readable by a processor, the instructions, when read and executed, for causing the processor to, in a first information handling system comprising a management controller configured to provide out-of-band management of the first information handling system, wherein the management controller comprises a baseboard management controller (BMC) and/or a chassis management controller (CMC):

communicatively couple the management controller to a mobile information handling system via a short-range wireless interface, in order to facilitate out-of-band management of the first information handling system by the mobile information handling system via the management controller; and operate the management controller as a proxy between a plurality of target management controllers of a corresponding plurality of other, physically separate, information handling systems that do not include respective short-range wireless interfaces and the mobile information handling system to facilitate out-of-band management of the plurality of other information handling systems by the mobile information handling system while communicatively coupled to the management controller, such that the mobile information handling system is able to perform out-of-band management of the plurality of other information handling systems via its connection to the management controller of the first information handling system.

11. The article of claim 10, the instructions for further causing the processor to establish a communications session between the management controller and a selected one of the target management controllers by:
   receiving a multicast message from the selected target management controller via a network communicatively coupled to the target management controller and the management controller;
   communicating an acknowledgment message to the selected target management controller; and
   receiving information from the selected target management controller regarding an other information handling system in which the selected target management controller is located.

12. The article of claim 10, the instructions for further causing the processor to communicate from the management controller to the mobile information handling system information regarding an other information handling system in which the selected target management controller is located.

13. The article of claim 10, the instructions for further causing the processor to store at the management controller information regarding an other information handling system in which the selected target management controller is located.

\* \* \* \* \*